(12) United States Patent
Jun

(10) Patent No.: US 7,760,566 B2
(45) Date of Patent: Jul. 20, 2010

(54) SEMICONDUCTOR MEMORY DEVICE FOR PREVENTING SUPPLY OF EXCESS SPECIFIC STRESS ITEM AND TEST METHOD THEREOF

(75) Inventor: Bae-Sun Jun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 113 days.

(21) Appl. No.: 12/011,907

(22) Filed: Jan. 30, 2008

(65) Prior Publication Data

US 2008/0186785 A1 Aug. 7, 2008

(30) Foreign Application Priority Data

Feb. 2, 2007 (KR) ...................... 10-2007-0011082

(51) Int. Cl.
*G11C 29/00* (2006.01)
(52) U.S. Cl. ............... 365/201; 365/226; 365/225.7; 365/104; 365/96
(58) Field of Classification Search ........ 365/201, 365/225.7, 226, 104, 96, 72
See application file for complete search history.

(56) References Cited

U.S. PATENT DOCUMENTS

| | | | |
|---|---|---|---|
| 4,896,055 A * | 1/1990 | Fujii et al. ............... 326/13 |
| 5,949,726 A | 9/1999 | Tseng et al. | |
| 5,974,577 A | 10/1999 | Ma | |
| 5,994,886 A | 11/1999 | Shinozaki | |
| 6,356,498 B1 * | 3/2002 | Keeth ............... 365/226 |
| 6,462,554 B2 | 10/2002 | Brown | |
| 6,704,228 B2 * | 3/2004 | Jang et al. ............... 365/200 |

FOREIGN PATENT DOCUMENTS

| | | |
|---|---|---|
| JP | 10-289576 | 10/1998 |
| KR | 1994-0010340 | 5/1994 |
| KR | 2001-0087541 A | 9/2001 |
| KR | 1020060003434 A | 1/2006 |

* cited by examiner

*Primary Examiner*—Pho M Luu
*Assistant Examiner*—Tha-O Bui
(74) *Attorney, Agent, or Firm*—Mills & Onello, LLP

(57) ABSTRACT

A semiconductor memory device includes a memory core which receives a specific stress item and a pattern item from an external source, a switch part which provides the power supplied from an external source and a switch control part which controls the switch part. The memory core responds to the specific stress item to be tested for stability, and the switch control part isolates the switch part if the specific stress item is supplied to the memory core two or more times.

19 Claims, 2 Drawing Sheets

SEMICONDUCTOR MEMORY DEVICE FOR PREVENTING SUPPLY OF EXCESS SPECIFIC STRESS ITEM AND TEST METHOD THEREOF

CROSS-REFERENCE TO RELATED APPLICATIONS

This U.S. non-provisional patent application claims priority under 35 U.S.C §119 to Korean Patent Application 2007-11082 filed on Feb. 2, 2007, the entire content of which is hereby incorporated by reference.

BACKGROUND

Embodiments of the present invention relate to a semiconductor memory device, and more specifically to a semiconductor memory device for preventing excessive application of a specific stress item during a test operation and a test method thereof.

Testing of semiconductor memory devices is generally performed through a test device to determine whether the memory core operates normally. A semiconductor memory device undergoing testing by a test device is referred to in industry as a DUT (Device Under Test). The test device applies a test item to a semiconductor memory device in order to perform a test operation of the semiconductor memory device. The test item provided in the semiconductor memory device is supplied to the memory core. The test item commonly includes a specific stress item and a pattern item. In addition, the test device provides power to the memory core when performing a testing operation.

The memory core includes a plurality of memory cells, and has a voltage range within which the memory cells operate under normal conditions. When the test device applies a specific stress item to the memory core, a voltage level that is higher than levels within the voltage range of normal operation is applied to the memory core.

When performing the test mode, the memory core responds to the specific stress item to test stability of the memory cells. In other words, in a case where the memory core receives as input a specific stress item, power is provided by the test device to each cell in response. It is possible to perform a stability test on the memory cells of the memory core by supplying a higher voltage level than the normal voltage range.

Specific stress items can include WBI (Wafer Burn In) and HVS (High Voltage Stress). When WBI and HVS items are supplied to the memory core, a voltage level that is not within the normal voltage range is supplied to the memory core. The WBI item further exposes the memory core to a temperature level that is out of range with respect to the normal temperature operation of the memory cells.

When the semiconductor memory device is undergoing a test operation, a pattern item is provided after a specific stress item is applied to the memory core. In a test device, in a case where a pattern item is provided to the memory core, a voltage level within the voltage range of normal operation of the memory cells is supplied to the memory core. Accordingly, when a pattern item is input, the memory core operates under normal voltage conditions. The pattern items can include, for example, data (pattern data, hereafter) and addresses for performing a programming operation in the memory cells of the memory core. The memory core programs pattern data to each memory cell designated by the addresses, and performs verification and reading operations for the programmed pattern data. Through these operations of the memory core, a determination is made as to whether the memory cells of the semiconductor memory device are operating normally.

The above-mentioned test operation is typically performed on a wafer consisting of a plurality of memory chips. In other words, the test device tests the plurality of memory chips on the wafer, where the plurality of memory chips are each a semiconductor memory device. The test device repeats testing until it is determined that all chips are performing normally. For example, when test mode of the test device is performed, some of the memory chips are tested and confirmed normal. However, test failure may occur in some of the memory chips due to external conditions such as contact defects resulting from dirt particles present between the test device and the memory chips. The memory chips in which a test failure has occurred may have had received an input of a specific stress item and may not have had received a pattern item, or, alternatively, the chips experiencing test failure may not have received either of the specific stress item or pattern item.

In this case, the test device performs a retest operation on all of the memory chips. However, if the retested memory chips have already received the specific stress item in the former test, and receive the specific stress item input a second time, or additional times, the memory cells may be rendered inoperative, or may undergo a change in performance characteristics, due to the subsequent application of the specific stress item.

For example, when test mode is performed, if a test failure occurs in some of the memory chips on the wafer, the test device performs a retest operation on all of the memory chips on the wafer. In other words, memory chips that have been tested and confirmed as operating normally in the former test, and memory chips that have received input of a specific stress item and have not received a pattern item, receive the specific stress item input a second time. Memory chips which have received specific stress item input a first time during the first test operation and then receive the specific stress item input again a second time during the second, retest, operation, are therefore subjected to the higher voltage level a second time.

If a memory chip that is determined to operate normally in the first test operation receives input of the specific stress item a second time in the retest operation, the application of the higher voltage a second time to the chip subjects the chip to the possibility of becoming damaged or undergoing a change in performance characteristics as a result of over-stress.

SUMMARY OF THE INVENTION

Exemplary embodiments of the present invention are directed to a semiconductor memory device in which over-application of a specific stress item is prevented and further to a test method of such a device. In particular, the specific stress item is supplied to a memory chip on a wafer undergoing testing only a single time, rather than multiple times. Over-stress of the memory cells of the device due to repeated testing is thereby mitigated or prevented.

In one aspect, a semiconductor memory device comprises: a memory core configured to receive a specific stress item and a pattern item from an external source; a switch part configured to provide power supplied from an external source to the memory core; and a switch control part that controls the switch part, wherein the memory core is tested for stability in response to the specific stress item, and the switch control part isolates the switch part if the specific stress item is supplied to the memory core two or more times.

Power provided to the memory core during the test for stability can be at a voltage at a higher level than the normal operation voltages used by memory cells of the memory core.

The memory cells of the memory core can respond to the pattern item to test for normal operation.

The switch part can be activated and deactivated by the switch control part, the switch part comprising a plurality of PMOS transistors.

The switch control part can turn off the PMOS transistors if the specific stress item is supplied to the memory core two or more times.

The switch control part can turn on the PMOS transistors at a time when the pattern item is supplied to the memory core.

The switch control part can comprise: a specific stress item detecting part which outputs an activated first control signal when the specific stress item from an external source is supplied to the memory core; an eFUSE circuit which is placed in a blown state after the specific stress item is supplied to the memory core a first time; an eFUSE check circuit which detects a blown state of the eFUSE circuit and responds to the detected result to output an activated second switch control signal; and a switch control signal generating part which responds to the activated first and second switch control signal to generate an activated switch control signal, and which provides the generated switch control signal to the switch part.

The eFUSE circuit can maintain the blown state after the specific stress item is supplied to the memory core a first time.

The switch control signal can be provided to gates of the PMOS transistors of the switch part.

The PMOS transistors of the switch part can respond to the switch control signal to be turned off.

The eFUSE circuit can comprise an eFUSE which is cut off after the specific stress item is supplied to the memory chip a first time.

In another aspect, a test system comprises: a memory core; a test device configured to provide a specific stress item and a pattern item to the memory core; a switch part configured to provide power provided from the test device to the memory core; and a switch control part including a storage device indicating whether the specific stress item has been previously input to the memory core, and the switch control part controlling the switch part during test operation according to the program data of the storage device, wherein the test device provides the specific stress item to the memory core, and the test device programs the storage device after the specific stress item has been supplied at least one time to the memory core.

The switch control part can isolate the switch part when the specific stress item is supplied to the memory core, after the storage device is programmed.

In one embodiment, the switch control part does not isolate the switch part at a time of the test operation when the pattern item is supplied to the memory core.

The switch control part can comprise: a specific stress item detecting part which outputs an activated first switch control signal when the specific stress item is supplied from an external source; an eFUSE circuit having the storage device programmed by the test device after the specific stress item is supplied to the memory core at least one time; an eFUSE check circuit which detects the program state of the storage device of the eFUSE circuit, and responds to the detected result to output an activated second switch control signal; and a switch control signal generating part which responds to the activated first and second switch control signal to generate an activated switch control signal, and which provides the generated switch control signal to the switch part.

The switch part can respond to the activated switch control signal to be isolated.

In another aspect, a test method of testing a semiconductor memory device including a memory can include (a) receiving a specific stress item and a pattern item from an external source; and (b) providing power supplied from an external source to the memory core according to the condition whether the specific stress item is provided to the memory core, wherein the step (b) isolates the power supplied from an external source if the specific stress item is supplied to the memory core two or more times.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Figure 1:
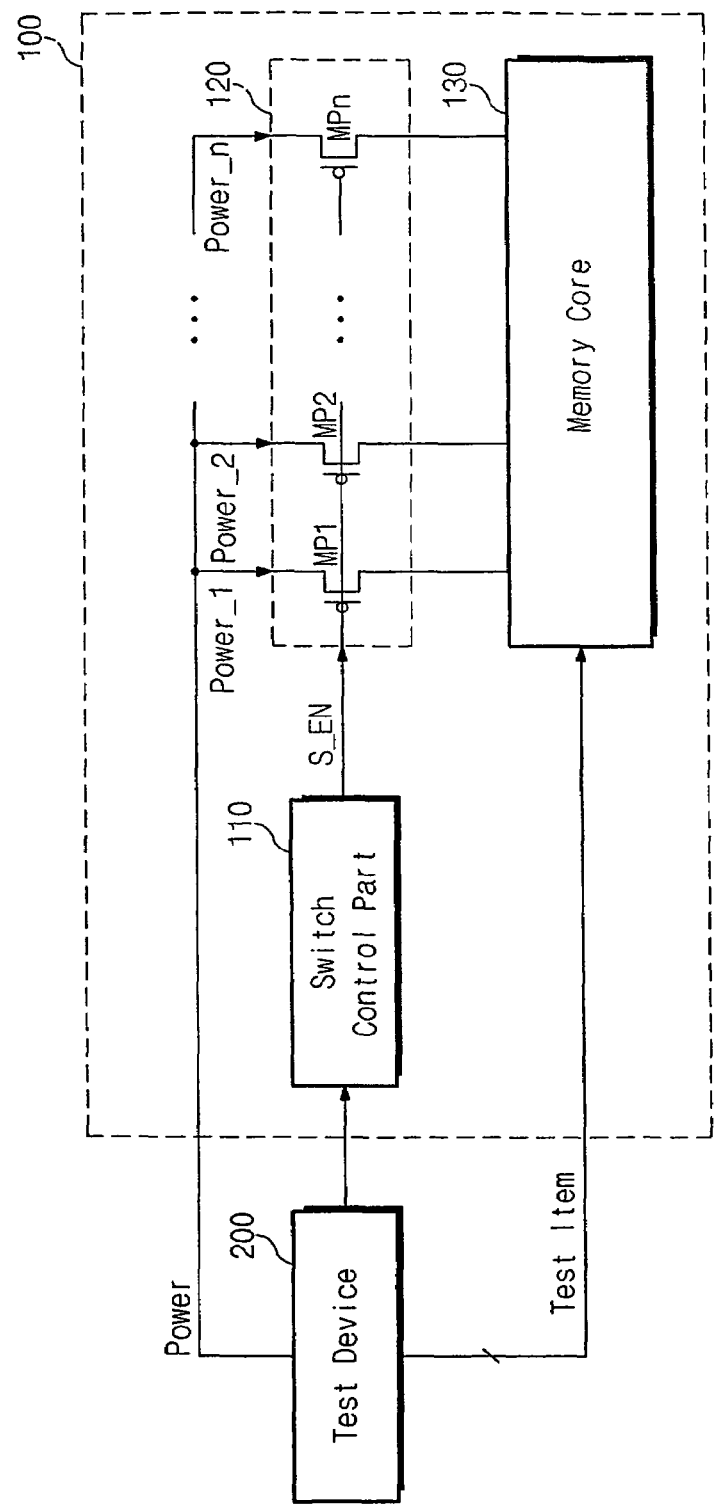
FIG. 1 is a block diagram of a semiconductor memory device according to an exemplary embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

A semiconductor memory device in accordance with embodiments of the present invention includes a memory core receiving a specific stress item and a pattern item from external source, a switch part providing power supplied from the external source to the memory core, and a switch control part controlling the switch part. The memory core is tested for stability in response to the specific stress item. The switch control part is isolated when the specific stress item is supplied to the memory core two or more times. Accordingly, the semiconductor memory device of the present invention may prevent the memory cell from being exposed to an over-stress when performing a retest operation.

FIG. 1 is a block diagram of the semiconductor memory device according to an exemplary embodiment of the present invention.

Referring to FIG. 1, the semiconductor memory device 100 according to an embodiment of the present invention includes a switch control part 110, a switch part 120, and a memory core 130. The switch part 120 includes a plurality of PMOS transistors MP1 to MPn, and the memory core 130 includes a plurality of memory cells (not shown).

The switch control part 110 of the semiconductor memory device 100 controls the switch part 120 in response to signals from the test device 200 in particular, the switch control part 110 turns off the switch part 120 when the specific stress item is supplied to the semiconductor memory device 100 two or more times.

The plurality of PMOS transistors MP1 to MPn of the switch part 120 serves as the switch for supplying power provided from the test device 200 to the memory core 130.

When a test operation of the memory core 130 is performed when the memory core is in a test mode, the memory core 130 receives a supply of power through the switch part 120 and an input of a test item from the test device 200. The memory core 130 performs a testing operation on the memory cells in response to the input test item.

The semiconductor memory device 100 performs a test operation to determine whether the memory core 130 is operating normally. When the test operation is performed on the semiconductor memory device 100, the device 100 is in a test mode, and an external test device 200 provides the test item to the memory core 130 of the semiconductor memory device 100, to perform testing of the semiconductor memory device 100. Also, the test device 200 provides power to the memory core 130. The test item can include one or more specific stress items and one or more pattern items. In a test operation, the test device 200 first provides the specific stress item to the memory core 130 of the semiconductor memory device 100.

The memory cells of the memory core 130 are constructed to operate normally within a predefined voltage range. When the test device 200 supplies the specific stress item to the memory core 130, it supplies to the memory core 130 power at a voltage level that is higher than the predefined voltage range for normal operation.

Power provided from the test device can include a plurality of power levels power_1 to power_n, which correspond to voltage levels for operating the memory cells of the memory core 130.

When the memory core 130 of the semiconductor memory device 100 receives input of the specific stress item, the switch control part 110 outputs a switch control signal S_EN at a low level L in response to signals from the test device 200. The low level L of the switch control signal S_EN output from the switch control part 110 is provided to the gates of the PMOS transistors MP1 to MPn of the switch part respectively. The PMOS transistors MP1 to MPn of the switch part 120 are turned on by the low level L of the switch control signal S_EN, the low level L of the switch control signal S_EN provided from the switch control part 110.

The plurality of power levels power_1 to power_n are supplied to each memory core 130 of the semiconductor memory device 100 through the corresponding turned-on PMOS transistors MP1 to MPn of the switch part 120.

The memory core 130 tests stability of the memory cells in response to the input specific stress item. In other words, when the memory core 130 receives input of the specific stress item, it supplies power levels power_1 to power_n to the cells respectively, the power levels power_1 to power_n being provided from the test device 200 in response to the input specific stress item. It is possible to perform a stability test of the memory cells of the memory core 130, by supplying power levels that correspond to voltage levels that are higher than the predefined normal voltage range for the memory cells.

When a test operation is performed, the memory core 130 of the semiconductor memory device 100 receives input of a pattern item from the test device 200 after receiving input of a specific stress item. When the test device 220 provides a pattern item to the memory core 130, power at a voltage level within the normal voltage range is provided to the semiconductor memory device 100. The switch control part provides the low level L of switch control signal S_EN to gates of each PMOS transistors MP1 to MPn of the switch part 120. Accordingly, the PMOS transistors MP1 to MPn of the switch part 120 are a turned-on state. The power provided through the test device 200 is supplied to the memory core 130 via the turned on PMOS transistors MP1 to MPn of the switch part 120. Accordingly, the memory core 130 operates normally when it receives input of pattern item.

The pattern items can include data (pattern data, hereafter) and addresses for performing program operation to the memory cells of the memory core 130. The memory core 130 programs the pattern data at the memory cells designated by the addresses respectively, and performs verification and reading operations for the programmed pattern data. Through these operations of the memory core 130, the memory cells of the semiconductor memory device 100 are tested for normal operation.

As mentioned above, in the conventional art retest of the semiconductor memory device 100 may be performed. When the retest mode is performed, if the semiconductor memory device 100 was tested and confirmed normal in the former test, or received input of only the specific stress item and not received the pattern item, in the conventional approach, that same device can receive input of the specific stress item a second, or additional, time. In embodiments in accordance with those of the present invention, when the retest mode is performed, the operation of the semiconductor memory device 100 which has received the specific stress item in the former test is as follows.

The semiconductor memory device 100 receives the specific stress item and the pattern item another time from the test device 200, to perform a retest operation on the memory core 130. The test device 200 first provides the specific stress item to the memory core 130 of the semiconductor memory device 100. The switch control part 110 of the semiconductor memory device 100 outputs a high level H of switch control signal S_EN to the switch part 120 by the control from the test device 200. The high level H of switch control signal S_EN is provided to the gates of PMOS transistors MP1 to MPn of the switch part 120 respectively. Accordingly, as the PMOS transistors MP1 to MPn of the switch part 120 are turned off, the switch part 120 is isolated.

If the test device 200 applies the specific stress item to the memory core 130, it provides power at a voltage level that is greater than the normal operation voltage range to the semiconductor memory device 100. However, as the switch part 120 is isolated as the transistors MPn are in an off state, power is not provided to the memory core 130.

The semiconductor memory device 100 receives input of the pattern item after receiving the specific stress item. As mentioned above, during this phase of the test operation, when the test device 220 provides a pattern item to the memory core 130, power at a voltage level within the normal voltage range is provided to the semiconductor memory device 100. The switch control part provides the low level L of switch control signal S_EN to gates of each PMOS transistors MP1 to MPn of the switch part 120. Accordingly, the PMOS transistors MP1 to MPn of the switch part 120 are a turned-on state. The power provided through the test device 200 is supplied to the memory core 130 via the turned on PMOS transistors MP1 to MPn of the switch part 120. Accordingly, the memory core 130 operates normally when it receives input of pattern item, with power being applied at voltage within the normal range.

Figure 2:
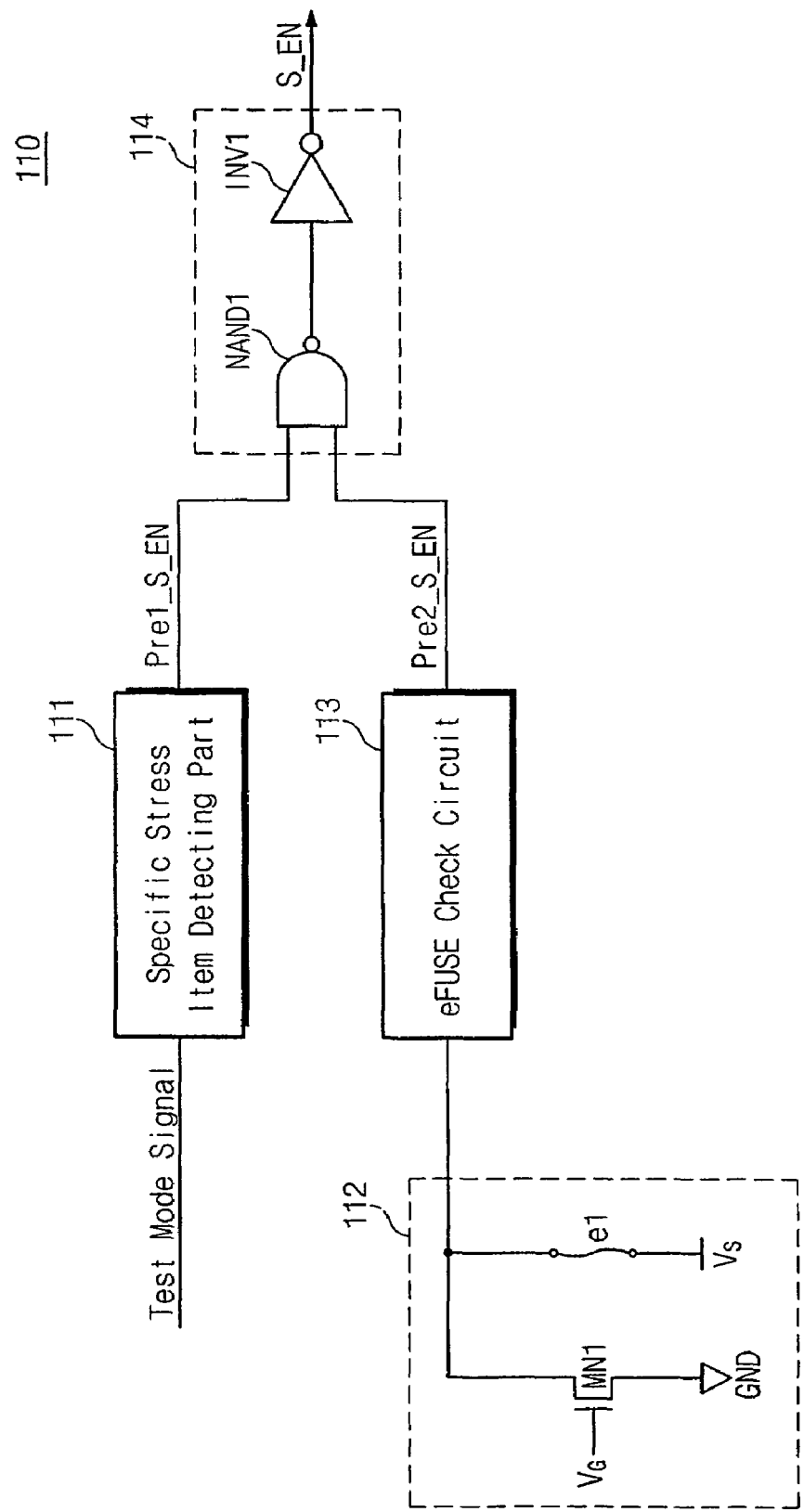
FIG. 2 is shows a detailed configuration of the switch control part illustrated in FIG. 1.

FIG. 2 shows a detailed configuration of the switch control part illustrated in FIG. 1.

Referring to FIG. 2, the switch control part 110 according to an exemplary embodiment of the present invention includes a specific stress item detecting part 111, an eFUSE circuit 112, an eFUSE check circuit 113, and a switch control signal generating part 114. The eFUSE circuit 112 includes an NMOS transistor MN1 and an eFUSE e1, and the switch control signal generating part 114 includes a NAND1 and an inverter INV1.

The specific stress item detecting part 111 generates a first switch control signal Pre1_S_EN under control from the external test device 200. In a case where the semiconductor memory device 100 receives a supply of the specific stress item, the first switch control signal Pre1_S_EN is activated. In one embodiment, the activated first switch control signal Pre1_S_EN is at a high level H. If the semiconductor memory device 100 receives the pattern item, the first switch control signal Pre1_S_EN is deactivated. The deactivated switch control signal Pre1_S_EN is at a low level L. The first switch control signal Pre1_S_EN generated by the specific stress item detecting part 111 is provided as a first input terminal of the NAND gate NAND1 of the switch control signal generating part 114.

A terminal at one end of the eFUSE e1 of the eFUSE circuit 112 is connected to the drain of the NMOS transistor, and a terminal on the other end receives a supply of a source voltage $V_S$. The gate of the NMOS transistor MN1 of the eFUSE circuit 112 receives a supply of a predetermined gate voltage $V_G$, and the source is connected to the ground voltage GND. When test mode of the semiconductor memory device 100 is performed, the eFUSE e1 of the eFUSE circuit 112 is blown when the specific stress item is supplied to the memory core 130 of the semiconductor memory device 100. The state of the eFUSE circuit 112 where the eFUSE e1 is cut off is referred to as being "blown".

The eFUSE check circuit 113 detects the state of eFUSE e1, and generates a second switch control signal Pre2_S_EN corresponding to the state of eFUSE e1. If the eFUSE check circuit 114 detects a blown state of the eFUSE e1, it generates an activated second switch control signal Pre2_S_EN. If a blown state of the eFUSE e1 is not detected, the eFUSE check circuit 114 generates a deactivated second switch control signal Pre2_S_EN. In one-embodiment, the activated second switch control signal Pre2_S_EN is at a high level H, and the deactivated second switch control signal Pre2_S_EN is at a low level L. The second switch control signal Pre2_S_EN generated at the eFUSE check circuit 113 is provided as a second input terminal of the NAND gate NAND1 of the switch control signal generating part 114.

The NAND gate NAND1 of the switch control signal generating part 114 logically combines the first switch control signal Pre1_S_EN input through the first input terminal and the second switch control signal Pre2_S_EN input through the second input terminal. The signal logically combined by the NAND gate NAND1 is inverted by the inverter INV1. The inverted signal by the inverter INV1 is provided to the gates of the PMOS transistors MP1 to MPn of the switch part 120 as the switch control signal S_EN respectively. Accordingly, the switch control signal generating part 114 receives input of the first switch control signal Pre1_S_EN and the second switch control signal Pre2_S_EN. And the switch control signal generating part 114 generates a switch control signal S_EN in response to the input first switch control signal Pre1_S_EN and the second switch control signal Pre2_S_EN. When the switch control signal S_EN becomes a high level H when it is activated, and the PMOS transistors MP1 to MPn of the switch part 120 are turned off by the activated switch control signal S_EN.

When test mode of the semiconductor memory device 100 is performed, the external test device 200 provides the specific stress item and the pattern item to the semiconductor memory device 100. Also, the test device 200 provides a-test mode signal for generating the first switch control signal Pre1_S_EN to the specific stress item detecting part 111. The test mode signal includes the control signal which corresponds to the specific stress item and the control signal which corresponds to the pattern item.

In a case the external test device 200 provides the specific stress item to the memory device 100, it provides the test mode signal corresponding to the specific stress item to the specific stress item detecting part 111. The specific stress item detecting part 111 generates an activated first switch control signal Pre1_S_EN in response to the input test mode signal. The first switch control signal Pre1_S_EN generated at the specific stress item detecting part 111 is provided to the first input terminal of the NAND gate NAND1 of the switch control signal generating part 114.

The external test device 200 provides a low level L of the source voltage $V_S$ to the eFUSE circuit 112 until the specific stress item is supplied to the memory core 130 of the semiconductor memory device 100. The gate of the NMOS transistor MN1 of the eFUSE circuit 112 receives a supply of a predetermined gate voltage $V_G$. As the terminal of the other end of the eFUSE e1 of the eFUSE circuit 112 receives a supply of a low level L of the source voltage $V_S$, the drain of the NMOS transistor MN1 receives a supply of a low level L of the source voltage $V_S$. The NMOS transistor MN1 is turned on by the predetermined gate voltage $V_G$. However, as the potential difference of the drain-source of the NMOS transistor MN1 is 0V, very low electric current flows in the NMOS transistor MN1 through the drain-source, and also very low electric current flows in the eFUSE e1. The eFUSE e1 tends to be cut off when a high electric current flows. Therefore, in this case, the eFUSE e1 is not cut off, and the eFUSE circuit 112 is not a blown state.

As the eFUSE e1 is not a blown state, the eFUSE check circuit 113 generates a deactivated second switch control signal Pre2_S_EN. The second switch control signal Pre2_S_EN generated at the eFUSE check circuit 113 is provided to the second input terminal of the NAND gate NAND1 of the switch control signal generating part 114.

The NAND gate NAND1 of the switch control signal generating part 114 logically combines the activated first switch control signal Pre1_S_EN input through from the first input terminal and the deactivated second switch control signal Pre2_S_EN input through the second input terminal. The signal logically combined by the NAND gate NAND1 is a high level H signal, and the logically combined signal of high level H is inverted to a low level L by the inverter INV1. The signal of low level L inverted by the inverter INV1 is provided to the gates of the PMOS transistors MP1 to MPn of the switch part 120 as a switch control signal S_EN respectively.

The PMOS transistors MP1 to MPn of the switch part 120 are turned on by the switch control signal S_EN of low level L provided from the switch control part 110. The memory core 130 of the semiconductor memory device 100 thus receives a supply of power at a higher voltage level than the predefined normal voltage range through the turned on PMOS transistors MP1 to MPn of the switch part 120.

After the specific stress item is supplied to the memory core 130, the external test device 200 provides a source voltage $V_S$ at a high level H to the eFUSE circuit 112.

The source voltage $V_S$ at a high level H is higher than the predetermined gate voltage $V_G$. As described above, the terminal of the other end of the eFUSE e1 receives a supply of the source voltage $V_S$, and the NMOS transistor MN1 is a turned-on state by the predetermined gate voltage $V_G$. As the terminal of the other end of the eFUSE e1 of eFUSE circuit 112 receives supply of the source voltage $V_S$ of high level H, the drain of the NMOS transistor MN1 receives supply of the source voltage $V_S$ of high level H. Therefore, the potential difference of the drain-source of the NMOS transistor MN1 is higher than the predetermined gate voltage $V_G$. In this case, high electric current flows in the NMOS transistor MN1 through drain-source, and high electric current flows also in the eFUSE e1. The eFUSE e1 is cut off as high electric current flows through it. The eFUSE circuit 112 is thus made to be in a permanently blown state because the eFUSE e1 is cut off.

With the eFUSE e1 in a blown state, the eFUSE check circuit 113 detects the blown state of the eFUSE circuit 112, and generates an activated second switch control signal Pre2_S_EN which corresponds to the detected result. The second switch control signal Pre2_S_EN generated at the eFUSE check circuit 113 is provided to the second input terminal of the NAND gate NAND1 of the switch control signal generating part 114.

An eFUSE e1 in a blown state is permanently blown. Therefore, after a specific stress item is supplied to the memory core 130, the eFUSE check circuit 113 outputs the activated second switch control signal Pre2_S_EN continuously.

When the external test device 200 provides the source voltage $V_S$ of a high level H to the eFUSE circuit 112, it provides the pattern item to the memory core 130 of the semiconductor memory device 100. Also, the external test device 200 provides the test mode signal corresponding to the pattern item to the specific stress item detecting part 111. The specific stress item detecting part 111 generates a deactivated first switch control signal Pre1_S_EN in response to input test mode signal. The first switch control signal Pre1_S_EN generated at the specific stress item detecting part 111 is provided to the first input terminal of the NAND gate NAND1 of the switch control signal generating part 114.

The NAND gate NAND1 of the switch control signal generating part 114 logically combines the deactivated first switch control signal Pre1_S_EN input through the first input terminal and the activated second switch control signal Pre2_S_EN input through the second input terminal. The signal logically combined by the NAND gate NAND1 is a high level H signal, and the high level H signal is inverted to a low level L by the inverter INV1. The low level L signal inverted by the inverter INV1 is provided to the gates of PMOS transistors MP1 to MPn of the switch part 120 as an activated switch control signal S_EN respectively.

The PMOS transistors MP1 to MPn of the switch part 120 are turned on by the activated switch control signal S_EN provided from the switch control part 110.

The next steps of operations of the semiconductor memory device 100 will be omitted as it is described previously.

As described above in connection with the conventional art, a retest operation of the semiconductor memory device 100 may be performed. When a retest operation is performed, if the semiconductor memory device 100 was tested and confirmed normal in the former test, or received an input of only the specific stress item and did not receive the pattern item, it receives an input of the specific stress item again. When the retest mode is performed, the operation of the semiconductor memory device in accordance with the present invention which has received the specific stress item in the former test is as follows.

The semiconductor memory device 100 receives the specific stress item and the pattern item again from the test device 200, to perform retest to the memory core 130. The specific stress item is provided first to the semiconductor memory device 100.

Also, the test device 200 provides the test mode signal corresponding to the specific stress item to the specific stress item detecting part 111. The specific stress item detecting part 111 generates an activated first switch control signal Pre1_S_EN in response to the test mode signal which corresponds to the input specific stress item. The first switch control signal Pre1_S_EN generated at the specific stress item 111 is provided to the first input terminal of the NAND gate NAND1 of the switch control signal generating part 114.

The eFUSE e1 is in a blown state as a result of application of the original test operation. Accordingly, the eFUSE check circuit 114 generates an activated second switch control signal Pre2_S_EN. The second switch control signal Pre2_S_EN generated at the eFUSE check circuit 114 is provided to the second input terminal of the NAND gate NAND1 of the switch control signal generating part 115.

The NAND gate NAND 1 of the switch control signal generating part 114 logically combines the activated first switch control signal Pre1_S_EN input through the first input terminal and the activated second switch control signal Pre2_S_EN input through the second input terminal. The signal logically combined by the NAND gate NAND1 is a low level L signal, and is inverted to a high level H by the inverter INV1. The high level H signal inverted by the inverter INV1 is provided to the gates of PMOS transistors MP1 to MPn of the switch part 120 as a switch control signal S_EN respectively.

The PMOS transistors MP1 to MPn of the switch part 120 are turned off by the switch control signal S_EN of a high level H provided from by switch control part 110.

Accordingly, when the memory core 130 receives input of the specific stress item from the test device 200 a second, or additional, times, it does not receive the supply of power of a higher voltage level than the normal voltage level range provided by the test device 200.

The semiconductor memory device 100 receives input of the pattern item after receiving a supply of the specific stress item, according to normal testing operations. As the operation of the switch control part 110 of the semiconductor memory device 100 when the pattern item is input is described above, it will not be repeated.

According to the previous description, the PMOS transistors MP1 to MPn of the switch part 120 are turned off in a case where the specific stress item is provided to the memory core 130 two or more times under the control from the switch control part 110. Therefore, power is not over-supplied to the memory core 130, namely, power at a higher voltage level than the voltage range of normal operation of the memory cells is not applied a second time to the core 130.

eFUSE e1 may optionally be a storage device which indicates whether the specific stress item had been supplied formerly to the memory core 130. The storage device is programmed after the specific stress item is supplied to the memory core 130. The programmed state of the storage device is a blown state. Accordingly, whether or not the specific stress item is supplied to the memory core is programmed at the storage device of the semiconductor memory device, when the pattern item is not input in the memory core during the test, ie. only when the specific stress item is supplied to the memory core. During the test operation, the switch control part 110 controls the switch part 120 according to the program data of the eFUSE, which is a storage device. As a result, when a retest operation is performed, in a case where a specific stress item is applied two or more times by the aforementioned operation of the switch control part 110, the semiconductor memory device 100 does not permit power of a higher voltage level than the normal operation voltage range to be supplied to the memory core 130. Therefore, the semiconductor memory device 100 of the present invention can prevent the memory cells from being over-stressed when a retest operation is performed.

While the invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device comprising:
    a memory core configured to receive a specific stress item and a pattern item from an external source;
    a switch part configured to provide power supplied from an external source to the memory core; and
    a switch control part that controls the switch part,
    wherein the memory core is tested for stability in response to the specific stress item, and the switch control part isolates the switch part if the specific stress item is supplied to the memory core two or more times, and
    wherein power provided to the memory core during the test for stability is at a voltage at a higher level than the normal operation voltages used by memory cells of the memory core.

2. The semiconductor memory device of claim 1, wherein the memory cells of the memory core respond to the pattern item to test for normal operation.

3. The semiconductor memory device of claim 1, wherein the switch part is activated and deactivated by the switch control part, the switch part comprising a plurality of PMOS transistors.

4. The semiconductor memory device of claim 3, wherein the switch control part turns off the PMOS transistors if the specific stress item is supplied to the memory core two or more times.

5. The semiconductor memory device of claim 3, wherein the switch control part turns on the PMOS transistors at a time when the pattern item is supplied to the memory core.

6. The semiconductor memory device of claim 1, wherein the switch control part comprises:
    a specific stress item detecting part which outputs an activated first control signal when the specific stress item from an external source is supplied to the memory core;
    an eFUSE circuit which is placed in a blown state after the specific stress item is supplied to the memory core a first time;
    an eFUSE check circuit which detects a blown state of the eFUSE circuit and responds to the detected result to output an activated second switch control signal; and
    a switch control signal generating part which responds to the activated first and second switch control signal to generate an activated switch control signal, and which provides the generated switch control signal to the switch part.

7. The semiconductor memory device of claim 6, wherein the eFUSE circuit maintains the blown state after the specific stress item is supplied to the memory core a first time.

8. The semiconductor memory device of claim 6, wherein the switch control signal is provided to gates of the PMOS transistors of the switch part.

9. The semiconductor memory device of claim 8, wherein the PMOS transistors of the switch part respond to the switch control signal to be turned off.

10. The semiconductor memory device of claim 6, wherein the eFUSE circuit comprises an eFUSE which is cut off after the specific stress item is supplied to the memory chip a first time.

11. A test system comprising:
    a memory core;
    a test device configured to provide a specific stress item and a pattern item to the memory core;
    a switch part configured to provide power provided from the test device to the memory core; and
    a switch control part including a storage device indicating whether the specific stress item has been previously input to the memory core, and the switch control part controlling the switch part during test operation according to the program data of the storage device,
    wherein the test device provides the specific stress item to the memory core, and the test device programs the storage device after the specific stress item has been supplied at least one time to the memory core, and
    wherein power provided to the memory core during the test for stability is at a voltage at a higher level than the normal operation voltages used by memory cells of the memory core.

12. The test system of claim 11, wherein the switch control part isolates the switch part when the specific stress item is supplied to the memory core, after the storage device is programmed.

13. The test system of claim 11, wherein the switch control part does not isolate the switch part at a time of the test operation when the pattern item is supplied to the memory core.

14. The test system of claim 11, wherein the switch control part comprises:
    a specific stress item detecting part which outputs an activated first switch control signal when the specific stress item is supplied from an external source;
    an eFUSE circuit having the storage device programmed by the test device after the specific stress item is supplied to the memory core at least one time;
    an eFUSE check circuit which detects the program state of the storage device of the eFUSE circuit, and responds to the detected result to output an activated second switch control signal; and
    a switch control signal generating part which responds to the activated first and second switch control signal to generate an activated switch control signal, and which provides the generated switch control signal to the switch part.

15. The test system of claim 14, wherein the switch part responds to the activated switch control signal to be isolated.

16. A semiconductor memory device comprising:
    a memory core configured to receive a specific stress item and a pattern item from an external source;
    a switch part configured to provide power supplied from an external source to the memory core; and
    a switch control part that controls the switch part,
    wherein the memory core is tested for stability in response to the specific stress item, and the switch control part isolates the switch part if the specific stress item is supplied to the memory core two or more times, and wherein the switch control part comprises:
        a specific stress item detecting part which outputs an activated first control signal when the specific stress item from an external source is supplied to the memory core;

an eFUSE circuit which is placed in a blown state after the specific stress item is supplied to the memory core a first time;
an eFUSE check circuit which detects a blown state of the eFUSE circuit and responds to the detected result to output an activated second switch control signal; and
a switch control signal generating part which responds to the activated first and second switch control signal to generate an activated switch control signal, and which provides the generated switch control signal to the switch part.

17. The semiconductor memory device of claim 16, wherein the eFUSE circuit maintains the blown state after the specific stress item is supplied to the memory core a first time.

18. The semiconductor memory device of claim 16, wherein the switch control signal is provided to gates of the PMOS transistors of the switch part.

19. The semiconductor memory device of claim 18, wherein the PMOS transistors of the switch part respond to the switch control signal to be turned off.

* * * * *